United States Patent
Sawada et al.

(10) Patent No.: US 9,468,092 B2
(45) Date of Patent: Oct. 11, 2016

(54) ELECTRICALLY CONDUCTIVE FILM

(71) Applicant: PANASONIC INTELLECTUAL PROPERTY MANAGEMENT CO., LTD., Osaka (JP)

(72) Inventors: Tomoaki Sawada, Osaka (JP); Shingo Yoshioka, Osaka (JP); Takatoshi Abe, Osaka (JP)

(73) Assignee: PANASONIC INTELLECTUAL PROPERTY MANAGEMENT CO., LTD, Osaka (JP)

( * ) Notice: Subject to any disclaimer, the term of this patent is extended or adjusted under 35 U.S.C. 154(b) by 0 days.

(21) Appl. No.: 14/405,572

(22) PCT Filed: Oct. 8, 2014

(86) PCT No.: PCT/JP2014/005132
§ 371 (c)(1),
(2) Date: Dec. 4, 2014

(87) PCT Pub. No.: WO2015/052932
PCT Pub. Date: Apr. 16, 2015

(65) Prior Publication Data
US 2015/0373838 A1     Dec. 24, 2015

(30) Foreign Application Priority Data

Oct. 10, 2013  (JP) ................................. 2013-212790
Mar. 7, 2014   (JP) ..................... PCT/JP2014/001304

(51) Int. Cl.
*B32B 3/12*     (2006.01)
*B32B 3/24*     (2006.01)
(Continued)

(52) U.S. Cl.
CPC .............. *H05K 1/0271* (2013.01); *C08J 5/18* (2013.01); *C08J 7/047* (2013.01); *C08K 7/02* (2013.01); *C08L 101/00* (2013.01); *C09D 105/16* (2013.01); *G06F 3/041* (2013.01); *H01B 1/02* (2013.01); *H01L 31/022491* (2013.01); *H05K 1/0274* (2013.01); *H05K 1/0296* (2013.01); *H05K 1/0326* (2013.01); *H05K 1/0333* (2013.01); *B32B 3/12* (2013.01);
(Continued)

(58) Field of Classification Search
None
See application file for complete search history.

(56) References Cited

U.S. PATENT DOCUMENTS 6,828,378 B2   12/2004   Okumura et al.
7,622,527 B2   11/2009   Ito et al.
(Continued)

FOREIGN PATENT DOCUMENTS

CN   103224711 A  *  7/2013
EP       560380 A1 *  9/1993
(Continued)

OTHER PUBLICATIONS

Machine Translation for CN 103224711 A, Jul. 2013.*
(Continued)

*Primary Examiner* — Jeff Vonch
(74) *Attorney, Agent, or Firm* — Greenblum & Bernstein, P.L.C.

(57) ABSTRACT

The present invention relates to an electrically conductive film characterized by being able to undergo elastic deformation, having little residual strain rate and exhibiting stress relaxation properties. More specifically, the present invention relates to an electrically conductive film wherein the stress relaxation rate (R) and the residual strain rate $\alpha$, as measured in a prescribed extension-restoration test, are as follows: $20\% \leq R \leq 95\%$ and $0\% \leq \alpha \leq 3\%$.

13 Claims, 2 Drawing Sheets

(51) Int. Cl.
*B32B 15/08* (2006.01)
*B32B 15/092* (2006.01)
*G06F 3/041* (2006.01)
*H01B 1/02* (2006.01)
*H01L 31/0224* (2006.01)
*H05K 1/03* (2006.01)
*H05K 1/02* (2006.01)
*C08J 5/18* (2006.01)
*C08K 7/02* (2006.01)
*C08L 101/00* (2006.01)
*C08J 7/04* (2006.01)
*C09D 105/16* (2006.01)
*B32B 3/26* (2006.01)

(52) U.S. Cl.
CPC .............. *B32B 3/266* (2013.01); *B32B 15/08* (2013.01); *B32B 15/092* (2013.01); *B32B 2307/202* (2013.01); *B32B 2307/412* (2013.01); *B32B 2307/50* (2013.01); *B32B 2363/00* (2013.01); *C08J 2300/21* (2013.01); *C08J 2367/02* (2013.01); *C08J 2400/21* (2013.01); *C08J 2463/00* (2013.01); *H05K 2201/012* (2013.01); *H05K 2201/0108* (2013.01); *Y10T 428/24331* (2015.01); *Y10T 428/24917* (2015.01)

(56) References Cited

U.S. PATENT DOCUMENTS

| | | | | |
|---|---|---|---|---|
| 7,626,128 | B2 * | 12/2009 | Takada | H05K 9/009 174/389 |
| 7,847,049 | B2 | 12/2010 | Ito et al. | |
| 8,094,247 | B2 | 1/2012 | Allemand et al. | |
| 8,334,547 | B2 | 12/2012 | Tsutsumi et al. | |
| 8,357,858 | B2 * | 1/2013 | Khosla | H01B 1/24 174/254 |
| 8,716,425 | B2 * | 5/2014 | Stewart | B29C 71/02 523/105 |
| 8,753,736 | B2 * | 6/2014 | Johnson | B32B 7/06 428/143 |
| 8,760,606 | B2 | 6/2014 | Allemand et al. | |
| 2003/0138398 | A1 | 7/2003 | Okumura et al. | |
| 2008/0097039 | A1 | 4/2008 | Ito et al. | |
| 2008/0143906 | A1 | 6/2008 | Allemand et al. | |
| 2009/0079322 | A1 | 3/2009 | Tsutsumi et al. | |
| 2009/0088546 | A1 | 4/2009 | Ito et al. | |
| 2010/0247810 | A1 | 9/2010 | Yukinobu et al. | |
| 2011/0088770 | A1 | 4/2011 | Allemand et al. | |
| 2011/0291058 | A1 * | 12/2011 | Kunishi | G06F 3/044 252/514 |
| 2012/0220728 | A1 | 8/2012 | Uekusa et al. | |
| 2012/0269990 | A1 * | 10/2012 | Sim | C08L 71/00 428/1.6 |
| 2013/0057138 | A1 | 3/2013 | Tsutsumi et al. | |
| 2014/0377579 | A1 * | 12/2014 | Ren | H01B 1/02 428/605 |
| 2015/0047883 | A1 * | 2/2015 | Shapira | H01B 13/0026 174/255 |
| 2016/0122605 | A1 * | 5/2016 | Hayashi | C09D 167/04 525/54.3 |

FOREIGN PATENT DOCUMENTS

| | | |
|---|---|---|
| EP | 2 497 789 A1 | 9/2012 |
| JP | 2002-339205 A | 11/2002 |
| JP | 2003-113561 A | 4/2003 |
| JP | 2005-154675 A | 6/2005 |
| JP | 2006-127928 | 5/2006 |
| JP | 2006316089 A * | 11/2006 |
| JP | 2009-76361 A | 4/2009 |
| JP | 2009-163959 A | 7/2009 |
| JP | 2010-507199 A | 3/2010 |
| JP | 4482633 B2 | 6/2010 |
| JP | 2012-27488 A | 2/2012 |
| JP | 2012-63437 A | 3/2012 |
| WO | 01/83566 A1 | 11/2001 |
| WO | WO 2005062679 A1 * | 7/2005 |
| WO | 2009/057637 A1 | 5/2009 |
| WO | WO 2014196636 A1 * | 12/2014 |
| WO | WO 2015052853 A1 * | 4/2015 |
| WO | WO 2015052931 A1 * | 4/2015 |

OTHER PUBLICATIONS

Graz et al., Extended cyclic uniaxial loading of stretchable gold thin-films on elastomeric substrates, Feb. 2009, Applied Physics Letters, vol. 94.*
Perichon et al., Stretchable gold conductors on elastomeric substrates, Jul. 2003, Applied Physics Letters, vol. 82.*
Vandeparre et al., Extremely robust and conformable capacitive pressure sensors based on flexible polyurethane foams and stretchable metallization, Nov. 2013, Applied Physics Letters, vol. 103.*
Panasonic Corp., Panasonic Develops a Stretchable Resin Film and its Application Materials for Stretchable Electronics, Dec. 2015.*
Written Opinion of the International Searching Authority and International Search Report for PCT application No. PCT/JP2014/005132, mailing date Jan. 23, 2015.
Database WPI, Week 200637, Thomson Scientific, London, GB; AN 2006-355843 XP002734420, & JP2006-127928 A (MITSUBISHI CHEM CORP), May 18, 2006, abstract.
International Search Report issued with respect to application No. PCT/JP2014/001304, mailed Jul. 8, 2014.

* cited by examiner

ELECTRICALLY CONDUCTIVE FILM

TECHNICAL FIELD

The present invention relates to an electrically conductive film having high tensile stress relaxation properties and excellent recoverability following extension.

BACKGROUND ART

Transparent electrodes, which are electrically conductive materials, exhibit excellent light transmission properties, electrical conductivity, and the like, and are therefore used in a wide variety of fields, such as display devices equipped with touch panels. As we have moved towards an ambient information society in recent years, there has been a desire to develop wearable electronic devices which are not restricted by real space and which can be worn on the body.

Indium tin oxide (hereinafter abbreviated in ITO) can be given as an example of an electrically conductive material used in the past in touch panel displays. However, ITO exhibits crystalline film characteristics, and therefore breaks easily. Therefore, in cases where a PET film, for example, is used as a flexible substrate in the use of ITO, the film needs to be thick in order to prevent changes in resistance. In addition, depletion of resources is a problem with indium used in ITO.

Under circumstances such as these, attempts have been made to use metal materials (see Patent Document 1). However, when using a metal to obtain a transparent electrode that exhibits satisfactory light-transmittance, it is essential for the metal layer to be extremely thin. In addition, means have been considered for providing openings in order to achieve light transmission properties. For example, providing openings in an electrode layer of a metal electrode provided with a substrate and a metal electrode layer formed on the surface of the substrate is a known feature. In this type of method, however, it is necessary to use a layer separation mechanism, such as a block copolymer, on the substrate, and such mechanisms are flexible, but are not stretchable and cannot be said to be able to conform to requirements satisfactorily in terms of attachability and ability to follow a variety of shapes.

CITATION LIST

Patent Literature

[Patent Document 1] Japanese Patent Application Publication No. 2009-76361

SUMMARY OF INVENTION

In view of circumstances such as those mentioned above, an object of the present invention is to provide an electrically conductive film which exhibits recoverability following extension and stress relaxation properties, thereby addressing the requirements of attachability and shape following properties.

That is, one aspect of the present invention is an electrically conductive film characterized by being able to undergo elastic deformation, having little residual strain and exhibiting stress relaxation properties.

In addition, another aspect of the present invention is a variety of devices that use this electrically conductive film (displays, touch sensors, solar cells, and the like).

DESCRIPTION OF EMBODIMENTS

Figure 1:
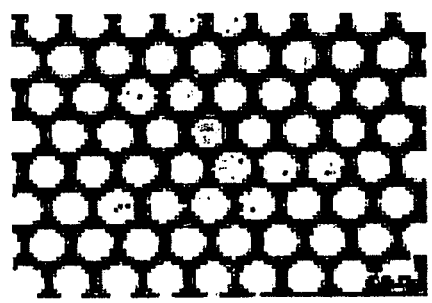
FIG. 1 shows an example of a regular mesh-like structure of a metal layer used in an embodiment of the present invention.

As a result of diligent research, the inventors of the present invention managed to provide an electrically conductive film which exhibits both elastic recoverability and stress relaxation properties, which has little residual strain upon elastic recovery after extension and which can relax residual stress upon deformation by forming a metal layer having a regular mesh-like structure or an irregular random mesh-like structure on a substrate that is able to undergo elastic deformation.

According to the present invention, it is thought that it is possible to provide an electrically conductive film which exhibits excellent recoverability following extension and stress relaxation properties and which does not lose electrical conductivity even when subjected to deformations such as extension or recovery. In addition, this electrically conductive film can be used in a variety of interfaces, such as sensors or displays, which require attachability and shape following properties.

In addition to interfaces, this electrically conductive film can also be used in a variety of applications that require attachability and shape following properties, such as flexible batteries, including solar cells, medical applications and automotive applications, and is therefore industrially applicable and extremely useful.

Embodiments of the present invention will now be explained in greater detail, but the present invention is not limited to these embodiments.

The electrically conductive film according to the present embodiment has a structure in which a metal layer having a regular mesh-like structure or an irregular random mesh-like structure is formed on one surface of a resin substrate that is able to undergo elastic deformation. Here, being able to undergo elastic deformation means that a deformation occurring as a result of being subjected to a force returns to its initial state once the force is removed, and more specifically means that even if the film is subjected to a stretching deformation of at least 25%, the film returns to its original state once the force is removed.

For the sake of convenience, the residual strain rate and stress relaxation properties of the resin composition are defined in the present embodiment by the stress relaxation rate (R) and the residual strain rate
α(alpha),
as measured in the extension-restoration test described below.

It is preferable for the resin composition of the present embodiment to be a resin composition in which the stress relaxation rate (R) is 20 to 95% and the residual strain rate α is 0 to 3%.

The present embodiment relates to an electrically conductive film obtained by forming a metal layer having a regular mesh-like structure or an irregular random mesh-like structure on one surface of a resin substrate that is able to undergo elastic deformation, that is, this resin substrate, and is characterized in that this film has a residual strain rate of 0 to 3% and a stress relaxation rate of 20 to 95%.

It is thought that an electrically conductive film having a residual strain rate and stress relaxation rate that fall within ranges such as these will exhibit excellent recoverability following extension, high stress relaxation properties during tension, and excellent attachability and shape following properties.

In addition, it is preferable for the electrically conductive film of the present embodiment to exhibit high electrical conductivity, and if transparency is also high, the electrically conductive film can be used as a transparent electrically conductive film. Electrically conductive films are used in a variety of applications, but electrically conductive films having a surface resistance of 1000 W/or lower can be advantageously used as electrodes for touch sensors, and highly transparent electrically conductive films (having a total light transmittance of 70% or higher) can be advantageously used as transparent electrodes for displays and the like.

<Extension-restoration test>

In the extension-restoration test used in the present embodiment, a piece of film (thickness: 50 micrometer, sample shape: No. 6 type dumbbell (width of measured portion: 4 mm, length of linear portion: 25 mm)) is subjected to an extension process and then a restoration process under the conditions described below using a tensile-compression tester (for example, an Autograph (model AGS-X) manufactured by Shimadzu Corporation) in accordance with ISO 3384, and the stress relaxation rate (R) and the residual strain rate α are calculated using the calculation methods described below.

(Extension process conditions)

In order to eliminate deflection generated when the test piece is attached to the clamp, deflection correction is carried out at a force of 0.05 N or lower.

Speed of testing: 25 mm/min (0 to 25% extension)
Temperature conditions: 23 degrees Celsius
(Restoration process conditions)
Speed of testing: 0.1 mm/min (until the tensile force reaches 0±0.05 N)
Temperature conditions: 23 degrees Celsius Stress relaxation rate calculation method: The tensile force is measured at the point when the extension process is complete, and this is defined as the initial tensile force ($F_{AO}$). The amount of strain is then maintained for 5 minutes under the extension/holding conditions, after which the tensile force is measured. This is defined as $F_A(t_5)$. The stress relaxation rate (R) is calculated using the following formula.

$$R = \frac{F_{AO} - F_A(t5)}{F_{AO}} \times 100$$

Residual strain rate calculation method: The amount of strain is measured at the point where the tensile force in the restoration process reaches 0±0.05 N, and this is defined as the residual strain rate α.

The resin composition used in the resin substrate in the present embodiment is not particularly limited in terms of composition as long as it is possible to form a resin substrate of an electrically conductive film which satisfies the characteristics mentioned above and which is able to undergo elastic deformation.

It is preferable for the resin composition of the present embodiment to contain at least a thermosetting resin and a curing agent for this resin. Furthermore, an epoxy resin is a preferred example of the thermosetting resin.

A more specific embodiment thereof is, for example, a resin composition that contains (A) a polyrotaxane, (B) a thermosetting resin and (C) a curing agent. These components will now be explained in greater detail.

The polyrotaxane of the component (A) is a molecule having a structure in which a straight chain axial molecule passes through a cyclic molecule and the axial molecule is blocked at the molecular terminals so that the cyclic molecule cannot become detached. A specific example thereof is the polyrotaxane disclosed in Japanese Patent No. 4482633.

Examples of the polyrotaxane (A) able to be used in the present embodiment include a compound in which a molecule having terminal functional groups, which is an axial molecule, is enclathrated by a cyclic molecule, and these terminal functional groups are chemically modified by blocking groups that are sufficiently bulky for the cyclic molecule not to become detached. A molecule having this type of structure is not limited in terms of the structure and type of the constituent molecules, the enclathration rate of the cyclic molecule, the production method, and so on.

For example, axial molecules able to be contained in the polyrotaxane are not particularly limited as long as the molecule has a molecular weight of 10,000 or higher and can be chemically modified by a blocking group, and examples thereof include poly(vinyl alcohol), polyvinylpyrrolidone, poly(meth)acrylic acid cellulose-based resins, polyacrylamide, poly(ethylene oxide), poly(ethylene glycol), poly(propylene glycol), poly(vinyl acetal)-based resins, poly(vinyl methyl ether), polyamines, polyethyleneimines, casein, gelatin, starch, polyolefins, polyesters, poly(vinyl chloride), polystyrene, copolymers such as acrylonitrile-styrene copolymers, acrylic resins, polycarbonates, polyurethanes, poly(vinyl butyral), polyisobutylene, polytetrahydrofuran, polyamides, polyimides, polydienes, polysiloxanes, polyurea, polysulfides, polyphosphazene, polyketones, polyphenylene, polyhaloolefins, and derivatives thereof. Of these, poly(ethylene glycol) can be advantageously used.

In addition, the cyclic molecule able to be contained in the polyrotaxane is a ring-shaped molecule able to be penetrated by a polymer molecule, and is not particularly limited as long as the cyclic molecule has at least one reactive group able to react with a crosslinking agent. Specific examples thereof include cyclodextrin compounds, crown ether compounds, cryptand compounds, macrocyclic amine compounds, calixarene compounds and cyclophane compounds. Of these, cyclodextrin and substituted cyclodextrin compounds are preferred, and substituted cyclodextrin compounds obtained by introducing further reactive groups (functional groups) into the substituted structure are more preferred.

Examples of preferred functional groups introduced into the cyclic molecule of the polyrotaxane include hydroxyl groups, carboxyl groups, acrylic groups, methacrylic groups, epoxy groups, vinyl groups, and the like.

By introducing functional groups into the cyclic molecule in this way, it is possible to crosslink cyclic molecules to each other or crosslink the polyrotaxane and the resin by means of a crosslinking agent. In addition, a resin connected to a polyrotaxane in this way can achieve flexibility.

The structures that block the terminals of the polyrotaxane in the present embodiment (terminal-blocking groups) are not particularly limited as long as these structures are sufficiently bulky for the cyclic molecule not to become detached. Specifically, cyclodextrin groups, adamantane groups, dinitrophenyl groups, trityl groups, and the like can be used, and adamantane groups and the like can be advantageously used.

Molecules able to be used as the cyclic molecule are not particularly limited as long as a liner chain polymer molecule can be enclathrated by the ring of the cyclic molecule. A cyclodextrin is an example of a cyclic molecule able to be advantageously used. In addition, it is preferable for this cyclic molecule to have functional groups. Furthermore, it is preferable for the functional groups to be —OH groups, acrylic groups or methacrylic groups.

The polyrotaxane used in the present embodiment can be synthesized by means of a publicly known method (for example, the methods disclosed in WO 01/83566, Japanese Patent Application Publication No. 2005-154675 or Japanese Patent No. 4482633), but it is also possible to use a commercially available product, specifically SeRM Super Polymer A 1000 manufactured by Advanced Softmaterials, Inc.

Next, the thermosetting resin (B) is not particularly limited, and examples thereof include epoxy resins, phenol resins, polyimide resins, urea-based resins, melamine resins, unsaturated polyesters and urethane-based resins, but of these, epoxy resins are preferred.

Specific examples of the epoxy resin include bisphenol A type epoxy resins, bisphenol F type epoxy resins, bisphenol S type epoxy resins, aralkyl epoxy resins, phenol novolac type epoxy resins, alkylphenol novolac type epoxy resins, biphenol type epoxy resins, naphthalene type epoxy resins, dicyclopentadiene type epoxy resins, epoxidized condensation products of phenol compounds and aromatic aldehydes having phenolic hydroxyl groups, triglycidylisocyanurates and alicyclic epoxy resins. Depending on the circumstances, these epoxy resins can be used singly or as a combination of two or more types thereof.

A more preferred example of the epoxy resin is an epoxy resin which contains 2 or more epoxy groups and 3 methyl groups per molecule and which has a molecular weight of 500 or higher. This type of epoxy resin can be a commercially available one, for example JER 1003 (manufactured by Mitsubishi Chemical Corp., 7 to 8 methyl groups, 2 functional groups, molecular weight 1300), EXA-4816 (manufactured by DIC Corporation, molecular weight 824, many methyl groups, 2 functional groups), YP50 (manufactured by Nippon Steel & Sumikin Chemical Co., Ltd., molecular weight 60,000 to 80,000, many methyl groups, 2 functional groups), or the like.

In addition, epoxy resins such as those mentioned above can be used singly or as a combination of two or more types thereof.

The curing agent (C) is not particularly limited as long as the curing agent can act as a curing agent for the thermosetting resin of component (B). In particular, examples of preferred curing agents able to be used as curing agents for epoxy resins include phenol resins, amine-based compounds, acid anhydrides, imidazole-based compounds, sulfide compounds and dicyandiamide. In addition, it is possible to use a photoinitiator, a UV initiator or a thermal cationic initiator. Depending on the circumstances, these curing agents can be used singly or as a combination of two or more types thereof.

In addition, the polyrotaxane-containing resin composition of the present embodiment may further contain a crosslinking agent, and this crosslinking agent is not particularly limited as long as it is possible to create a structure in which at least a part of the cyclic molecule in the polyrotaxane (at least 1 reactive group in the cyclic molecule of the polyrotaxane) is crosslinked.

More specifically, it is possible to use an isocyanate, cyanuric chloride, trimesoyl chloride, terephthaloyl chloride, epichlorohydrin, dibromobenzene, glutaraldehyde, phenylene diisocyanate, tolylene diisocyanate, divinylsulfone, 1,1-carbonyldiimidazole, an alkoxysliane, and the like.

In the present embodiment, the number of functional groups in the crosslinking agent is not limited, but it is preferable for a molecule of the crosslinking agent to have 2 or more functional groups in order to crosslink cyclic molecules of the polyrotaxane to each other or crosslink the cyclic molecule and a resin such as that described below. In addition, in cases where the crosslinking agent contains a plurality of functional groups, these functional groups may be the same or different.

Furthermore, crosslinking agents that are compatible with polyrotaxanes are more preferred, and in cases where a polyrotaxane containing a cyclic molecule having a hydroxyl group is used as the polyrotaxane of component (A), an isocyanate compound, a derivative thereof, or the like can be advantageously used as the crosslinking agent. This isocyanate resin is not particularly limited. In addition, it is also possible to use a blocked isocyanate resin having a blocked isocyanate group.

Meanwhile, in cases where a polyrotaxane containing a cyclic molecule having an acrylic group or a methacrylic group is used as the polyrotaxane of component (A), it is possible to add an acrylic resin as a reactive resin. This acrylic resin is not particularly limited.

The proportions of the components in the resin composition are not particularly limited as long as the effect of the present invention can be achieved, but are 10 to 80 parts by mass, and preferably approximately 30 to 50 parts by mass, of the polyrotaxane (A), 10 to 89.9 parts by mass, and preferably 30 to 50 parts by mass, of the thermosetting resin (B), and 0.1 to 30 parts by mass, and preferably approximately 0.1 to 20 parts by mass, of the curing agent (C), relative to a total of 100 parts by mass of the components (A) to (C). Moreover, in cases where the resin composition of the present embodiment contains an isocyanate resin as a crosslinking agent, it is possible to add 0 to 50 parts by mass, and preferably 10 to 40 parts by mass, of the isocyanate resin to the polyrotaxane component (A).

Furthermore, the resin composition according to the present embodiment may, if necessary, contain other additives, such as a curing catalyst (a curing accelerator), a flame retardant, an auxiliary flame retardant, a leveling agent or a coloring agent, at quantities whereby the effect of the present invention is not impaired.

The method for producing the polyrotaxane-containing resin composition of the present embodiment is not particularly limited, and it is possible to obtain the resin composition of the present embodiment by, for example, homogeneously mixing a polyrotaxane, a curing agent, a crosslinking agent, a thermosetting resin and a solvent. The solvent used is not particularly limited, and can be toluene, xylene, methyl ethyl ketone, acetone, or the like. These solvents can be used singly or as a combination of two or more types thereof. In addition, if necessary, it is possible to blend an organic solvent or a variety of additives in the resin composition in order to adjust the viscosity of the composition.

By heating and drying the resin composition obtained in the manner described above, it is possible to cure the composition while evaporating off the solvent, thereby obtaining a resin substrate of film.

The method and apparatus used to heat and dry the resin composition, and the conditions used therefor, may be similar means to those used in the past or means obtained by improving those used in the past. The specific heating temperature and period can be set as appropriate according to the crosslinking agent and solvent used, and the like, but by heating and drying for a period of 60 to 120 minutes at a temperature of 50 to 200 degrees Celsius, for example, it is possible to cure the resin composition.

Next, another example of a specific embodiment of the resin composition used for the resin substrate of the present embodiment is, for example, a resin composition which contains (D) an epoxy resin, which is characterized by having a modified group that is modified by an alkylene oxide having 2 to 3 carbon atoms, containing this modified group at a quantity of 4 moles or more relative to 1 mole of epoxy groups in the molecule, having 2 moles or more of epoxy groups and having an epoxy equivalent quantity of 450 eq/mol or higher, and (E) a curing agent.

Specific examples of the epoxy resin (D) include a propylene oxide adduct type bisphenol A type epoxy resin (EP4003S manufactured by Adeka Corporation) and an ethylene oxide adduct type hydroxyphenyltluorene type epoxy resin (EG-280 manufactured by Osaka Gas Chemicals Co., Ltd.).

In addition, the epoxy resin-containing resin composition of the present embodiment may further contain an epoxy resin other than the epoxy resin (D) described above, such as a bisphenol A type epoxy resin, a bisphenol F type epoxy resin, a bisphenol S type epoxy resin, an aralkyl epoxy resin, an aliphatic epoxy resin or an alicyclic epoxy resin, at a quantity whereby the effect of the present invention is not impaired.

In such cases, the blending proportion of the epoxy resin (D) in the overall epoxy resin component is approximately 60 to 99 mass %, and preferably approximately 80 to 95 mass %.

The curing agent (E) can be one that is publicly known as a curing accelerator for epoxy resins. Specifically, a curing agent selected from among phenolic resins, acid anhydrides and sulfonium salts is preferred from the perspective of curing properties and, if necessary, it is possible to use a combination of this type of curing agent and a curing accelerator such as an imidazole-based compound or a combination of two or more of these curing agents.

The phenol curing agent can be a monomer, oligomer or polymer having 2 or more phenolic hydroxyl groups in the molecule and is not particularly limited in terms of molecular weight or molecular structure, but it is possible to use, for example, are resin obtained by subjecting a phenol compound, such as phenol, cresol, resorcin, catechol, bisphenol A, bisphenol F, phenylphenol or aminophenol, and/or a naphthol compound, such as α-naphthol, β-naphthol or dihydroxynaphthalene, and a compound having an aldehyde group, such as formaldehyde, to condensation or co-condensation in the presence of an acidic catalyst, examples of such resins being phenol novolac resins and cresol novolac resins, or a phenol aralkyl resin synthesized from a phenol compound and/or a naphthol compound and dimethoxy para-xylene or bis(methoxymethyl)biphenyl, and these curing agents can be used either singly or as a combination of two or more types thereof.

Examples of acid anhydride-based curing agents include maleic acid anhydride, succinic acid anhydride, itaconic acid anhydride, citraconic acid anhydride, phthalic acid anhydride, 1,2,3,6-tetrahydrophthalic acid anhydride, 3,4,5,6-tetrahydrophthalic acid anhydride, hexahydrophthalic acid anhydride, 4-methylhexahydrophthalic acid anhydride, 3-methyl-1,2,3,6-tetrahydrophthalic acid anhydride, 4-methyl-1,2,3,6-tetrahydrophthalic acid anhydride and methyl-3,6-endomethylene-1,2,3,6-tetrahydrophthalic acid anhydride.

Examples of sulfonium salt-based curing agents include alkyl sulfonium salts, benzyl sulfonium salts, dibenzyl sulfonium salts and substituted benzyl sulfonium salts. Specific examples thereof include alkyl sulfonium salts such as 4-acetophenyldimethyl sulfonium hexatluoroantimonate, 4-acetoxyphenyldimethyl sulfonium hexafluoroarsenate, dimethyl-4-(benzyloxycarbonyloxy)phenyl sulfonium hexafluoroantimonate, dimethyl-4-(benzoyloxy)phenyl sulfonium hexafluoroantimonate, dimethyl-4-(benzoyloxy) phenyl sulfonium hexafluoroarsenate and dimethyl-3-chloro-4-acetoxyphenyl sulfonium hexafluoroantimonate; benzyl sulfonium salts such as benzyl-4-hydroxyphenylmethyl sulfonium hexafluoroantimonate, benzyl-4-hydroxyphenylmethyl sulfonium hexafluorophosphate, 4-acetoxyphenylbenzylmethyl sulfonium hexafluoroantimonate, benzyl-4-methoxyphenylmethyl sulfonium hexafluoroantimonate, benzyl-2-methyl-4-hydroxyphenylmethyl sulfonium hexafluoroantimonate, benzyl-3-chloro-4-hydroxyphenylmethyl sulfonium hexafluoroarsenate and 4-methoxybenzyl-4-hydroxyphenylmethyl sulfonium hexafluorophosphate; dibenzyl sulfonium salts such as dibenzyl-4-hydroxyphenyl sulfonium hexafluoroantimonate, dibenzyl-4-hydroxyphenyl sulfonium hexafluorophosphate, 4-acetoxyphenyldibenzyl sulfonium hexafluoroantimonate, dibenzyl-4-methoxyphenyl sulfonium hexafluoroantimonate, dibenzyl-3-chloro-4-hydroxyphenyl sulfonium hexafluoroarsenate, dibenzyl-3-methyl-4-hydroxy-5-tert-butylphenyl sulfonium hexafluoroantimonate and benzyl-4-methoxybenzyl-4-hydroxyphenyl sulfonium hexafluorophosphate; and substituted benzyl sulfonium salts such as p-chlorobenzyl-4-hydroxyphenylmethyl sulfonium hexafluoroantimonate, p-nitrobenzyl-4-hydroxyphenylmethyl sulfonium hexafluoroantimonate, p-chlorobenzyl-4-hydroxyphenylmethyl sulfonium hexafluorophosphate, p-nitrobenzyl-3-methyl-4-hydroxyphenylmethyl sulfonium hexafluoroantimonate, 3,5-dichlorobenzyl-4-hydroxyphenylmethyl sulfonium hexafluoroantimonate and o-chlorobenzyl-3-chloro-4-hydroxyphenylmethyl sulfonium hexafluoroantimonate.

The proportions of the components in the resin composition are not particularly limited as long as the effect of the present invention can be achieved, but are 50 to 99 parts by mass, and preferably approximately 60 to 80 parts by mass, of the epoxy resin (D) and 1 to 50 parts by mass, and preferably approximately 1 to 40 parts by mass, of the curing agent (E) relative to 100 parts by mass of the overall resin composition.

Furthermore, the resin composition according to the present embodiment may, if necessary, contain other additives, such as a curing catalyst (a curing accelerator), a flame retardant, an auxiliary flame retardant, a leveling agent or a coloring agent, at quantities whereby the effect of the present invention is not impaired.

The method for producing the epoxy resin-containing resin composition of the present embodiment is not particularly limited, and it is possible to, for example, homogeneously mix the epoxy resin, the curing agent and a solvent. The solvent used is not particularly limited, and can be toluene, xylene, methyl ethyl ketone, acetone, or the like. These solvents can be used singly or as a combination of two or more types thereof. Furthermore, if necessary, it is possible to blend an organic solvent or a variety of additives in the resin composition in order to adjust the viscosity of the composition.

By heating and drying the resin composition obtained in the manner described above, it is possible to cure the composition while evaporating off the solvent, thereby obtaining a resin substrate of film.

The method and apparatus used to heat and dry the resin composition, and the conditions used therefor, may be similar means to those used in the past or means obtained by improving those used in the past. The specific heating temperature and period can be set as appropriate according to the crosslinking agent and solvent used, and the like, but by heating and drying for a period of 60 to 180 minutes at a temperature of 130 to 200 degrees Celsius, for example, it is possible to cure the resin composition.

The obtained resin substrate (a molded body that is a cured product of the aforementioned resin composition or the like) may be subjected to surface treatment in order to stably form the metal layer on one surface of the resin substrate. In addition, it is possible to add a variety of additives, for example, antioxidants, weathering stabilizers, flame retardants and anti-static agents, to the resin substrate at levels that do not impair the characteristics of the resin substrate.

The resin substrate in the present embodiment may be transparent or opaque, but more preferably has a degree of transparency whereby the total light transmittance is 70% or higher. In such cases, the electrically conductive film can be used as a transparent electrically conductive film. In cases where the polyrotaxane-containing resin composition of the present embodiment, such as that mentioned above, or an epoxy resin composition is used, the aforementioned transparency can be achieved by selecting an epoxy resin or curing agent therefor.

In addition, the thickness of the resin substrate is not particularly limited, but is preferably, for example, 10 to 200 micrometers from perspectives of handling properties, optical characteristics and attachability.

Next, specific examples of metals that are able to be used in the metal layer in the present embodiment are not particularly limited, but gold, silver, copper and aluminum can be advantageously used due to exhibiting high electrical conductivity. It is possible to use one of these metals or a combination of two or more types thereof. In addition, it is also possible to use an alloy that contains the listed metals as primary components.

In addition, the regular mesh-like structure of the metal layer in the present embodiment is not particularly limited in terms of constitution other than requiring the presence of openings that are not covered by a metal and requiring two arbitrarily selected points to be connected in a metal covering portion.

Figure 2:
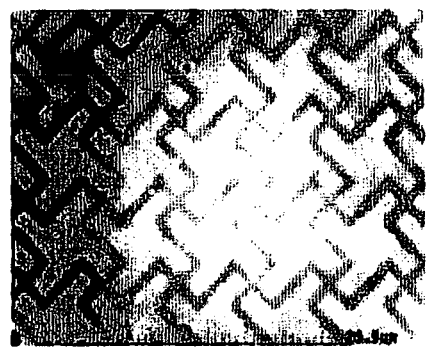
FIG. 2 shows an example of a network structure in a regular mesh-like structure of a metal layer.

In the metal layer of the present embodiment, specific examples of regular mesh-like structures include a mesh-like structure in which regularly aligned circular openings are provided, as shown in FIG. 1, and a network structure consisting of zigzag-shaped lines, as shown in FIG. 2.

Figure 4:
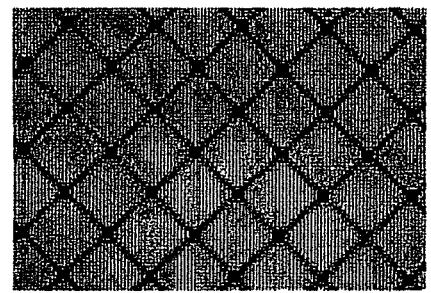
FIG. 4 shows another example of a regular mesh-like structure of a metal layer used in an embodiment of the present invention.

If the regular mesh-like structure is a network structure consisting of straight lines, as shown in FIG. 4, the stress exerted on the metal layer differs depending on the stretching direction, which leads to concerns that changes in resistance will also differ. In addition, there is the possibility that disconnection will occur in the stretching direction and electrical conductivity will be lost. As a result, it is preferable to use a metal layer having a mesh-like structure that does not include a linear shape that extends in one direction in order to prevent differences in changes in resistance occurring according to stretching direction.

On the other hand, an irregular random mesh-like structure can also be used as an aspect of the metal layer in the present embodiment. Here, irregular random mesh-like structure means that the shape and arrangement of the openings are not regular. Even an irregular random mesh-like structure is not particularly limited in terms of constitution other than requiring the presence of openings that are not covered by a metal and requiring two arbitrarily selected points to be connected in a metal covering portion. Specifically, it is possible to use, for example, an irregular random mesh-like structure such as that shown in FIG. 3.

Moreover, in these mesh-like structures and random mesh-like structures, the shape of the openings that are not covered by a metal may be circular or polygonal and is not limited in any way, but it is preferable for the area of metal-covered portions other than the openings in the metal layer to be 5 to 80% relative to the area of the entire surface of the metal layer side of the mesh-like structure or random mesh-like structure. Within a numerical range such as this, it is possible to achieve high electrical conductivity and high stretchability.

Furthermore, it is preferable for the metal layer (the metal-covered portion) having a regular mesh-like structure or an irregular random mesh-like structure such as that mentioned above to have a thickness of 10 micrometer or lower. If the metal layer has a thickness over 10 micrometer, the flexibility of the metal layer per se is reduced, which leads to concerns regarding disconnection readily occurring during stretching. Furthermore, the line width in this metal layer (metal-covered portion) does not need to be fixed, but it is at least preferable for the portion having the minimum line width to have a line width 0.1 micrometer or higher. If the line width is lower than 0.1 micrometer, disconnection readily occurs during stretching.

The metal layer having a regular mesh-like structure or an irregular random mesh-like structure such as that described above can be formed using a publicly known method. For example, the metal layer can be formed by a method consisting of forming a metal layer on a resin substrate by vacuum deposition and then patterning by photolithography. Alternatively, the metal layer can be formed by a lift-off method consisting of forming a resist mask in advance, applying a metal layer by vacuum deposition, and then peeling off the resist mask. In addition, the method for forming the metal layer is not limited, and can be, for example, a pattern plating method or a method consisting of transferring a metal layer formed on another substrate.

It is preferable for all or a part of the metal layer to be embedded in the resin substrate. By doing so, it is considered further suppression of disconnection can be implemented during stretching and changes in resistance. In this case, the metal layer can be formed by embedding the metal layer using the transfer method mentioned above.

In addition, it is possible to provide, between the metal layer and the resin substrate (at the interface therebetween), a resin layer having a composition that is different from that of the resin substrate. In particular, it is possible to further suppress disconnection during stretching and changes in resistance by selecting as a material of this type of resin layer a resin composition that exhibits high adhesive properties to both the metal used and the resin substrate or a resin composition having high elasticity.

Moreover, it is possible to use a support body such as a PET film as appropriate when forming the electrically conductive film in the present embodiment. It is possible to obtain the electrically conductive film of the present embodiment by forming the resin substrate on this type of support body and then forming the metal layer by using a method such as that mentioned above.

In addition, patterning can be carried out by partially removing the metal layer from the electrically conductive film of the present embodiment. The removal method is not particularly limited, and it is possible to use a conventional means or apparatus, such as laser etching or chemical etching.

The electrically conductive film of the present embodiment exhibits excellent recoverability following extension and stress relaxation properties and does not lose electrical conductivity even when subjected to deformations such as extension or recovery, and can therefore be used as an electrode or wiring circuit for a display, touch sensor, solar cell, or the like.

The present Description discloses a variety of features, as described above, but of these, the main features will now be summarized.

One aspect of the present invention is an electrically conductive film obtained by forming a metal layer having a regular mesh-like structure or an irregular random mesh-like structure on a resin substrate that is able to undergo elastic deformation. In addition, it is preferable for the stress relaxation rate R and the residual strain rate α, as measured in the extension-restoration test described above, to satisfy the following formulas:

$20\% \leq R \leq 95\%$ and $0\% \leq \alpha \leq 3\%$.

By means of this constitution, it is possible to provide an electrically conductive film which exhibits excellent recoverability following extension and stress relaxation properties and which does not lose electrical conductivity even when subjected to deformations such as extension or recovery.

Furthermore, it is preferable for the resin substrate to contain at least a thermosetting resin and a curing agent for this resin. In this way, it is possible to more reliably obtain a material having particularly excellent stress relaxation properties and recoverability following extension.

In addition, it is preferable for the thermosetting resin to contain an epoxy resin. In this way, it is possible to achieve both high stress relaxation properties and high recoverability, and also possible to achieve heat resistance and toughness.

In addition, in the electrically conductive film, it is preferable for the metal layer to contain at least one of gold, silver, copper, aluminum and combinations of these metals. By doing so, it is possible to more reliably obtain an electrically conductive film having excellent electrical conductivity.

In addition, in the metal layer, it is preferable for the area covered by metal to be 5 to 80%. In this way, it is possible to more reliably achieve high electrical conductivity and high stretchability.

Furthermore, it is preferable for the metal layer to have a thickness of 10 micrometer or lower and a minimum line width of 0.1 micrometer or higher. In this way, the benefits of increased flexibility of the metal layer and decreased occurrences of disconnection during stretching can be obtained.

In addition, in the electrically conductive film, it is preferable for some or all of the metal layer to be embedded in the resin substrate that is able to undergo elastic deformation.

By using this type of constitution, the adhesive properties between the metal layer and the resin substrate layer can be further enhanced.

In addition, it is preferable to have, between the metal layer and the resin substrate layer, a resin layer having a composition that is different from the resin of the resin substrate layer. By doing so, it is possible to further suppress disconnection during stretching and changes in resistance.

In addition, it is preferable for the electrically conductive film to have a total light transmittance of 70% or higher. In this way, the electrically conductive film can be used as a transparent electrically conductive film.

Another aspect of the present invention is a patterned electrically conductive film obtained by partially removing the metal layer of the electrically conductive film.

Furthermore, the present invention encompasses displays, touch sensors and solar cells that use the electrically conductive film. The electrically conductive film of the present invention can be used in a wide variety of applications which can closely follow free-form surfaces and adapt to significant deformations.

The present invention will now be explained in greater detail through the use of working examples, but is in no way limited to these working examples.

EXAMPLES

First, the various materials used in the present working examples are as follows.

(thermosetting resin)
Polyrotaxane ("A1000" manufactured by Advanced Softmaterials, Inc., containing PEG as the axial molecule, α-cyclodextrin as the cyclic molecule, and OH groups as reactive groups)
Epoxy resin ("JER1003" manufactured by Mitsubishi Chemical Corp., 7 to 8 methyl groups, 2 functional groups, molecular weight 1300)
Epoxy resin ("EXA-4816" manufactured by DIC Corporation, molecular weight 824, many methyl groups, 2 functional groups)
Epoxy resin "YP50" manufactured by Nippon Steel & Sumikin Chemical Co., Ltd., molecular weight 60,000 to 80,000, many methyl groups, 2 functional groups)
Ethylene oxide adduct type hydroxyphenylfluorene type epoxy resin ("EG-280" manufactured by Osaka Gas Chemicals Co., Ltd.)
Propylene oxide adduct type bisphenol A type epoxy resin ("EP4003S" manufactured by Adeka Corporation)
(Curing agents)
Polyfunctional phenol-based curing agent ("GPH-103" manufactured by Nippon Kayaku Co., Ltd., biphenyl aralkyl type phenol compound)
Imidazole-based curing accelerator ("2E4MZ" manufactured by Shikoku Chemicals Corporation, 2-ethyl-4-methylimidazole)
Polyisocyanate (isocyanate, "DN 950" manufactured by DIC Corporation)

Cationic curing agent ("SI-150" manufactured by Sanshin Chemical Industry Co., Ltd., sulfonium hexafluoroantimonate)

(Resin substrate comparative examples)

PET film ("A4300" manufactured by Toyobo Co., Ltd.)

<Preparation of resin substrates 1 to 5>

Resin compositions for resin substrates 1 to 5 were prepared by adding the blending components (parts by mass) shown in Table 1 below to a solvent (methyl ethyl ketone) so that the solid content concentration was 40 mass %, and then homogeneously mixing the components.

Next, the obtained resin composition was coated on a PET film (support body) having a thickness of 75 micrometers using a bar coater, dried for 10 minutes at 100 degrees Celsius so as to remove the solvent, and then cured by heating for 60 minutes at 170 degrees Celsius so as to obtain a resin film having a thickness of 50 micrometers on the PET film.

TABLE 1

|  |  | Resin substrate (1) | Resin substrate (2) | Resin substrate (3) | Resin substrate (4) | Resin substrate (5) |
|---|---|---|---|---|---|---|
| Component (A) | A1000 | 100 | 100 | — | — | — |
|  | jER1003 | 100 | — | — | — | — |
|  | YP-50 | — | 100 | — | — | — |
|  | EXA4816 | — | — | 100 | — | — |
|  | EG-280 | — | — | — | 100 | — |
|  | EP-4003S | — | — | — | — | 100 |
| Component (B) | GPH-103 | — | — | — | 49 | 49 |
|  | 2E4MZ | 1.5 | 1.5 | — | 0.15 | 0.15 |
|  | SI-150L | — | — | 2 | — | — |
|  | DN-950 | 45 | 45 | 45 | — | — |

<Preparation of Electrically Conductive Film>

Examples 1 to 9 and Comparative Examples 1 to 3, 5, 7, 9 and 11

Mesh-like pattern resist layers were formed by laminating a dry film resist on the resin substrates or films shown in Tables 2 and 3, exposing the resist to light using a mask having a dotted mesh-like pattern, a zigzag mesh-like pattern or a random mesh-like pattern, and then developing. Resin films having mesh-like patterned metal layers were then obtained by vapor depositing the resin films having mesh-like patterned resist layers by a magnetron sputtering method so that the film thickness was 10 nm in the case of gold (Au), 10 nm in the case of silver (Ag) and 100 nm in the case of ITO, and then detaching the resist by means of an aqueous solution of caustic soda.

Figure 3:
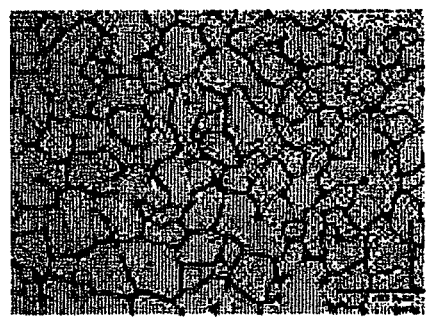
FIG. 3 shows an example of an irregular random mesh-like structure of a metal layer used in an embodiment of the present invention.

The metal coverage rate (metal covered area) of the dotted mesh-like pattern was 50% (opening ratio: 50%) and the minimum line width was 30 micrometer (see FIG. 1), the metal coverage rate of the zigzag mesh-like pattern was 30% (opening ratio: 70%) and the minimum line width was 30 micrometer (see FIG. 2), and the metal coverage rate of the random mesh-like pattern was 8% (opening ratio: 92%) and the minimum line width was 5 micrometer (see FIG. 3).

Example 10

A mesh-like pattern resist layer was formed by laminating a dry film resist on a PET film, exposing the resist to light using a mask having a random mesh-like pattern, and then developing. A PET film having a mesh-like patterned metal layer was then obtained by vapor depositing the PET film having a mesh-like patterned resist layer by a magnetron sputtering method so that the Ag film thickness was 10 nm, and then detaching the resist by means of an aqueous solution of caustic soda. The PET film having a mesh-like patterned metal layer was immersed in an aqueous solution of an electrodeposition resist (Elecoat PI, manufactured by Shimizu Co., Ltd.), thereby electrodepositing a resist resin on the metal layer. A resin film having a thickness of 50 micrometer was obtained on the PET film having an electrodeposited mesh-like patterned metal layer by coating the resin composition for the resin substrate 5 on the surface of the PET film having an electrodedeposited mesh-like patterned metal layer, removing the solvent by drying for 10 minutes at 100 degrees Celsius, and then curing by heating for 60 minutes at 170 degrees Celsius.

Comparative Examples 4, 6, 8 and 10

Resin films having metal layers were obtained by vapor depositing Ag at a film thickness of 10 nm or ITO at a film thickness of 100 nm on resin films by a magnetron sputtering method.

A piece of film (thickness: 50 micrometer, sample shape: No. 6 type dumbbell (width of measured portion: 4 mm, length of linear portion: 25 mm)) was obtained from each of the obtained electrically conductive film and used as a sample in the following evaluations.

<Extension-restoration test>

In the extension-restoration test used in the present embodiment, the samples of the working examples and comparative examples were subjected to an extension process and then a restoration process under the conditions described below, and the stress relaxation rate (R) and the residual strain rate α were calculated using the calculation methods described below.

(Extension Process Conditions)

In order to eliminate deflection generated when the test piece was attached to the clamp, deflection correction was carried out at a force of 0.05 N or lower.

Speed of testing: 25 mm/min (0 to 25% extension)

Temperature conditions: 23 degrees Celsius

Extension/holding conditions: Holding for 5 minutes at 25% extension (Restoration Process Conditions)

Speed of testing: 0.1 mm/min (until the tensile force reaches 0±0.05 N)

Temperature conditions: 23 degrees Celsius

Stress relaxation rate calculation method: The tensile force was measured at the point when the extension process is complete, and this was defined as the initial tensile force ($F_{A0}$). The amount of strain was then maintained for 5 minutes under the extension/holding conditions, after which the tensile force was measured. This was defined as $F_A$ ($t_{10}$). The stress relaxation rate (R) was calculated using the following formula.

$$R = \frac{F_{AO} - F_A(t5)}{F_{AO}} \times 100$$

Residual strain rate calculation method: The amount of strain was measured at the point where the tensile force in the restoration process reached 0±0.05 N, and this was defined as the residual strain rate α.

The obtained stress relaxation rates (R) and residual strain rates α are shown in Table 1.

Furthermore, when the resin compositions were extended to 15 to 20% in the extension-restoration test, the slope of the change in tensile force relative to the amount of strain during restoration and that during extension (slope during restoration/slope during extension) were determined. These results are also shown in Tables 2 and 3.

<Stress Relaxation Properties Test>

The samples of the working examples and comparative examples were subjected to an extension process under the conditions described below using a tensile-compression tester in accordance with ISO 3384, and at the point where the extension was complete, the tensile force was measured and defined as the initial tensile force ($F_{B0}$). 30 minutes thereafter, the tensile force ($F_B(t_{30})$) was measured.

(Extension Process Conditions)

In order to eliminate deflection generated when the test piece was attached to the clamp, deflection correction was carried out. The deflection correction was carried out at a force of 0.05 N or lower.

Speed of testing: 25 mm/min (up to 50% extension)
Temperature conditions: 23 degrees Celsius
Extension/holding conditions: Holding for 30 minutes at 50% extension In addition, the value of $F_B(t_{30})/F_{B0}$, was calculated. The results are shown in Tables 2 and 3.

<Measurement of Surface Resistance Value>

The surface resistance value of the obtained electrically conductive films was measured using a tester in accordance with ISO 3195. The results are shown in Tables 2 and 3.

<Measurement of Total Light Transmittance>

The total light transmittance of the obtained electrically conductive films was measured using a tester in accordance with ISO 2556. The results are shown in Tables 2 and 3.

<Measurement of Rate of Increase in Resistance During Stretching Operation>

The obtained electrically conductive films were cut to length of 6 cm and widths of 5 mm and set on a film drawing machine so that the distance between clamps was 4 cm. Next, the resistance value was measured using a resistance meter (RM3548 manufactured by Hioki E.E. Corporation) at a position whereby the distance between terminals was 3 cm before the film was extended, when the film was extended to an extension of 25% and when the clamps were released and the film returned to its original position. The increase in resistance from the resistance value prior to stretching is shown in terms of percentage in Tables 2 and 3.

TABLE 2

|  | Example 1 | Example 2 | Example 3 | Example 4 | Example 5 | Example 6 | Example 7 | Example 8 | Example 9 | Example 10 |
|---|---|---|---|---|---|---|---|---|---|---|
| Resin substrate | Resin substrate (1) | Resin substrate (1) | Resin substrate (2) | Resin substrate (2) | Resin substrate (3) | Resin substrate (3) | Resin substrate (4) | Resin substrate (4) | Resin substrate (5) | Resin substrate (5) |
| Metal/pattern in electrically conductive layer | Au/Dotted mesh | Au/Zigzag mesh | Ag/Random mesh | Au/Dotted mesh | Au/Zigzag mesh | Ag/Random mesh | Au/Dotted mesh | Au/Zigzag mesh | Ag/Random mesh | Ag/Random mesh Transferred pattern |
| Stress relaxation rate R (20-95%) | 31.0% | 31.0% | 39.5% | 39.5% | 43.0% | 43.0% | 82.7% | 82.7% | 53.2% | 53.2% |
| Residual strain α (0-3%) | 0.8% | 0.8% | 1.1% | 1.1% | 2.7% | 2.7% | 2.8% | 2.8% | 2.7% | 2.7% |
| Surface resistance (Ω/□) | 43 | 170 | 5 | 43 | 170 | 5 | 43 | 170 | 5 | 5 |
| Total light transmittance (%) | 77% | 85% | 75% | 77% | 85% | 75% | 77% | 85% | 75% | 74% |
| Increase in resistance following film stretching (times) | 3 times | 3 times | 10 times | 3 times | 3 times | 10 times | 3 times | 3 times | 10 times | 5 times |
| Increase in resistance following film recovery (times) | 1.1 times | 1.1 times | 1.5 times | 1.1 times | 1.1 times | 1.5 times | 1.1 times | 1.1 times | 1.5 times | 1.2 times |

TABLE 3

|  | Comparative Example 1 | Comparative Example 2 | Comparative Example 3 | Comparative Example 4 | Comparative Example 5 | Comparative Example 6 | Comparative Example 7 | Comparative Example 8 | Comparative Example 9 | Comparative Example 10 | Comparative Example 11 |
|---|---|---|---|---|---|---|---|---|---|---|---|
| Resin substrate | A4300 | A4300 | A4300 | Resin substrate (1) | Resin substrate (2) | Resin substrate (3) | Resin substrate (4) | Resin substrate (5) | Resin substrate (1) | Resin substrate (2) | Resin substrate (3) |
| Metal/pattern in electrically | Au/Dotted | Au/Zigzag | Ag/Random | ITO/Whole | ITO/Dotted | Ag/Whole | ITO/Zigzag | ITO/Whole | ITO/Dotted | Ag/Whole | ITO/Zigzag |

TABLE 3-continued

|  | Comparative Example 1 | Comparative Example 2 | Comparative Example 3 | Comparative Example 4 | Comparative Example 5 | Comparative Example 6 | Comparative Example 7 | Comparative Example 8 | Comparative Example 9 | Comparative Example 10 | Comparative Example 11 |
|---|---|---|---|---|---|---|---|---|---|---|---|
| conductive layer | mesh | mesh | mesh | surface | mesh | surface | mesh | surface | mesh | surface | mesh |
| Stress relaxation rate R (20-95%) | 2.0% | 2.0% | 2.0% | 31.0% | 39.5% | 43.0% | 82.7% | 53.2% | 31.0% | 39.5% | 43.0% |
| Residual strain α (0-3%) | 20.0% | 20.0% | 20.0% | 0.8% | 1.1% | 2.7% | 2.8% | 2.7% | 0.8% | 1.1% | 2.7% |
| Surface resistance (Ω/□) | 43 | 170 | 5 | 56 | 700 | 0.3 | 1200 | 56 | 700 | 0.3 | 1200 |
| Total light transmittance (%) | 77% | 85% | 75% | 85% | 86% | 10% | 86% | 85% | 86% | 10% | 86% |
| Increase in resistance following film stretching (times) | 3 times | 3 times | 10 times | ∞ | ∞ | 100 times | ∞ | ∞ | ∞ | 100 times | ∞ |
| Increase in resistance following film recovery (times) | Did not recover | Did not recover | Did not recover | 1200 times | 1200 times | 3 times | 1200 times | 1200 times | 1200 times | 3 times | 1200 times |

(Results and Discussion)

In Comparative Examples 1 to 3, electrically conductive films were prepared by using a PET film (A4300), which is a conventional thermoplastic film and has been actually used as a flexible substrate for electrically conductive films, as the resin substrate and using the mesh-like patterned metal layer formation method that was used in the examples in the present invention, and these electrically conductive films were compared with the examples.

In Comparative Examples 4 to 11, electrically conductive films were prepared by using ITO and a metal layer which had an electrically conductive layer covering rate of 100% and which had not been subjected to mesh-like patterning, as electrically conductive layers used in conventional transparent electrically conductive films and using resin substrates 1 to 5, which were used in the examples in the present application, and these electrically conductive films were compared with the examples.

The results showed that in comparison with electrically conductive films that used the resin substrate of the present invention (Examples 1 to 10), electrically conductive films that used a PET film (Comparative Examples 1 to 3) exhibited extremely low stress relaxation rates even in cases where electrically conductive materials were used, exhibited high residual strain, and exhibited low film recoverability. However, Examples 1 to 10 exhibited excellent stress relaxation properties and underwent little increase in resistance after stretching, and even after recovery.

Meanwhile, electrically conductive films that used a conventional ITO in the electrically conductive layer (Comparative Examples 4, 5, 7, 8, 9 and 11) exhibited excellent stress relaxation properties, but the resistance value following film extension could not be detected, and the electrically conductive layer was almost completely lost. In addition, the resistance values of these electrically conductive films recovered to a certain extent following film restoration, but the resistance value following restoration was significantly higher than that prior to stretching.

Furthermore, electrically conductive films in which a mesh-like pattern was not formed (Comparative Examples 6 and 10) exhibited results whereby the resistance value after film stretching was far higher than electrically conductive films in which a mesh-like pattern was formed.

Therefore, the electrically conductive film of the present invention is far superior in terms of stress relaxation properties and recoverability than various materials used in the past, is flexible, and exhibits excellent electrical conductivity after stretching and after recovery.

This application is based on Japanese Patent Application No. 2013-212790 filed on Oct. 10, 2013 and International Patent Application No. PCT/JP2014/001304 filed on Mar. 7, 2014, and the contents of this earlier application are included in the present application.

In order to embody the present invention, the present invention has been appropriately and adequately explained by means of the specific embodiments, but it should be recognized that a person skilled in the art could easily amend and/or reform the embodiments. Therefore, as long as amended or reformed modes carried out by a person skilled in the art do not depart from the scope of the claims described in the claims of the present invention, these amended or reformed modes are interpreted as being encompassed by the scope of the claims.

INDUSTRIAL APPLICABILITY

The present invention exhibits broad industrial applicability in a wide range of technical fields, such as optics, electronics, adhesives and medicines.

The invention claimed is:

1. An electrically conductive film obtained by forming a metal layer having a regular mesh-like structure or an irregular random mesh-like structure on a resin substrate that is able to undergo elastic deformation, the stress relaxation rate (R) and the residual strain rate (α), as measured in a extension-restoration test described below, satisfy the following relationships:

20%≤R≤95% and

0%≤α≤3%;

wherein in the extension-restoration test a piece of the electrically conductive film having a thickness of 50 μm and a shape of No. 6 dumbbell having a width of measured portion of 4 mm and a length of linear portion of 25 mm being subjected to an extension process and then a restoration process under the conditions described below using a tensile-compression tester in accordance with ISO 3384, and the stress relaxation rate (R) and the residual strain rate (α) being calculated using the calculation methods described below, Extension process conditions:
deflection correction is carried out at a force of 0.05 N or lower,
Speed of testing: 25 mm/min at 0 to 25% extension;
Temperature conditions: 23° C.;
Extension/holding conditions: holding for 5 minutes at 25% extension;

Restoration process conditions:
Speed of testing: 0.1 mm/min until the tensile force reaches 0±0.05 N;
Temperature conditions: 23° C.;

Stress relaxation rate calculation method:
the tensile force being measured at the point when the extension process is complete, and this being defined as the initial tensile force ($F_{A0}$), then the amount of strain being maintained for 5 minutes under the extension/holding conditions, after which the tensile force is measured, and this being defined as $F_A(t_5)$, with the stress relaxation rate (R) being calculated using the following formula:

$$R = \frac{F_{A0} - F_A(t5)}{F_{A0}} \times 100;$$

Residual strain rate calculation method:
the amount of strain being measured at the point where the tensile force in the restoration process reaches 0±0.05 N, and this being defined as the residual strain rate (α).

2. The electrically conductive film according to claim 1, wherein the resin substrate contains at least a thermosetting resin.

3. The electrically conductive film according to claim 2, wherein the thermosetting resin contains an epoxy resin.

4. The electrically conductive film according to claim 1, wherein the metal layer contains at least one of gold, silver, copper, aluminum and combinations of these metals.

5. The electrically conductive film according to claim 1, wherein in the metal layer, the area covered by metal is 5 to 80%.

6. The electrically conductive film according to claim 1, wherein the thickness of the metal layer is 10 micrometers or lower and the minimum line width of the metal layer is 0.1 micrometers or more.

7. The electrically conductive film according to claim 1, wherein a part or all of the metal layer is embedded in the resin substrate that is able to undergo elastic deformation.

8. The electrically conductive film according to claim 1, which has, between the metal layer and the resin substrate layer, a resin layer having a composition that is different from the resin of the resin substrate layer.

9. The electrically conductive film according to claim 1, which has a total light transmittance of 70% or higher.

10. A patterned electrically conductive film obtained by partially removing the metal layer in the electrically conductive film according to claim 1.

11. A display that uses the electrically conductive film according to claim 1.

12. A touch sensor that uses the electrically conductive film according to claim 1.

13. A solar cell that uses the electrically conductive film according to claim 1.

* * * * *